(12) United States Patent
Tai et al.

(10) Patent No.: US 10,055,288 B2
(45) Date of Patent: Aug. 21, 2018

(54) CONTROLLER DEVICE AND OPERATION METHOD FOR NON-VOLATILE MEMORY WITH 3-DIMENSIONAL ARCHITECTURE

(71) Applicant: VIA Technologies, Inc., New Taipei (TW)

(72) Inventors: Ying Yu Tai, Mountain View, CA (US); Jiin Lai, New Taipei (TW); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 113 days.

(21) Appl. No.: 15/225,846

(22) Filed: Aug. 2, 2016

(65) Prior Publication Data
US 2017/0212801 A1    Jul. 27, 2017

Related U.S. Application Data

(60) Provisional application No. 62/281,700, filed on Jan. 21, 2016.

(51) Int. Cl.
*H03M 13/00* (2006.01)
*G06F 11/10* (2006.01)
(Continued)

(52) U.S. Cl.
CPC .......... *G06F 11/1072* (2013.01); *G06F 3/064* (2013.01); *G06F 3/0619* (2013.01);
(Continued)

(58) Field of Classification Search
CPC .... G06F 11/1072; G06F 3/0619; G06F 3/064; G06F 3/0688; G06F 11/1012; G06F 11/1044; G06F 11/1068; G11C 16/0483; G11C 2029/0409; G11C 2029/0411; G11C 7/1006; G11C 29/78; G11C 11/5642;
(Continued)

(56) References Cited

U.S. PATENT DOCUMENTS 8,996,838 B1    3/2015   D'Abreu et al.
2008/0266991 A1*  10/2008  Lee ..................... G06F 11/1044
                                                    365/203

(Continued)

OTHER PUBLICATIONS

"Office Action of Taiwan Counterpart Application," dated Jun. 6, 2017, p. 1-p. 12.

*Primary Examiner* — Guerrier Merant
(74) *Attorney, Agent, or Firm* — JCIPRNET

(57) ABSTRACT

A controller device and an operation method for a non-volatile memory with 3-dimensional architecture are provided. The controller device includes an error checking and correcting (ECC) circuit and a controller. The controller is coupled to the non-volatile memory and the ECC circuit. The controller may access a target wordline of the non-volatile memory in accordance with a physical address. The controller groups a plurality of wordlines of the non-volatile memory into a plurality of wordline groups, wherein different wordline groups have different codeword structures. The controller controls the ECC circuit according to the codeword structure of the wordline group of the target wordline, and the ECC circuit generates a codeword to be stored in the target wordline or check a codeword from the target wordline under control of the controller.

24 Claims, 9 Drawing Sheets

(51) Int. Cl.
*G06F 3/06* (2006.01)
*G11C 16/04* (2006.01)
*G11C 29/04* (2006.01)

(52) U.S. Cl.
CPC ........ *G06F 3/0688* (2013.01); *G11C 16/0483* (2013.01); *G11C 2029/0409* (2013.01); *G11C 2029/0411* (2013.01)

(58) Field of Classification Search
CPC ......... H03M 13/2906; H03M 13/2942; H03M 13/255; H03M 13/11
See application file for complete search history.

(56) References Cited

U.S. PATENT DOCUMENTS

| | | | |
|---|---|---|---|
| 2013/0024605 A1* | 1/2013 | Sharon | G06F 11/1072 711/103 |
| 2013/0227200 A1* | 8/2013 | Cometti | G06F 12/0246 711/103 |
| 2014/0245098 A1* | 8/2014 | Sharon | G06F 11/1012 714/755 |
| 2016/0306593 A1* | 10/2016 | Xie | G06F 3/0659 |
| 2017/0229186 A1* | 8/2017 | Karakulak | G11C 16/26 |

* cited by examiner

CONTROLLER DEVICE AND OPERATION METHOD FOR NON-VOLATILE MEMORY WITH 3-DIMENSIONAL ARCHITECTURE

CROSS-REFERENCE TO RELATED APPLICATION

This application claims the priority benefit of U.S. provisional application Ser. No. 62/281,700, filed on Jan. 21, 2016. The entirety of the above-mentioned patent application is hereby incorporated by reference herein and made a part of this specification.

BACKGROUND OF THE INVENTION

1. Field of the Invention

The invention relates to a non-volatile memory, and particularly relates to a controller device and an operation method for a non-volatile memory with a 3-dimensional architecture.

2. Description of Related Art

The techniques of NAND flash memory have been developed to exhibit a 3-dimensional architecture. FIG. 1 is a schematic perspective view illustrating a flash memory 100 with a 3-dimensional architecture. As shown in FIG. 1, a bit line 110, an upper selector 120, a wordline 130, and a lower selector 140 are stacked on a substrate 150. In the flash memory 100 with the 3-dimensional architecture, a plurality of the wordlines 130 are stacked between the upper selector 120 and the lower selector 140. In addition, the number of layers of the wordlines 130 is determined based on design requirements. A plurality of channels 160 penetrate through the upper selector 120, the wordlines 130, and the lower selector 140, as shown in FIG. 1.

FIG. 2 is a schematic top view illustrating the flash memory 100 with the 3-dimensional architecture shown in FIG. 1. FIG. 3 is an equivalent circuit diagram of the channel 160 shown in FIGS. 1 and 2. The flash memory 100 with the 3-dimensional architecture shown in FIG. 3 has five layers of the wordlines 130, which are respectively labeled as wordlines 130_1, 130_2, 130_3, 130_4, and 130_5. The channel 160 shown in FIG. 3 has an upper switch 161 and a lower switch 163. A first terminal of the upper switch 161 is coupled to a corresponding bit line 110. A control terminal of the upper switch 161 is controlled by a control signal DSG of the upper selector 120. A first terminal of the lower switch 163 is coupled to a source line 170 of the substrate 150. A control terminal of the lower switch 163 is controlled by a control signal SSG of the lower selector 140. The channel 160 shown in FIG. 3 further includes five floating gate transistors 162_1, 162_2, 162_3, 162_4, and 162_5, and gates of the floating gate transistors 162_1, 162_2, 162_3, 162_4, and 162_5 are respectively controlled by the wordlines 130_1, 130_2, 130_3, 130_4, 130_5. The floating gate transistors 162_1, 162_2, 162_3, 162_4, and 162_5 are serially connected between a second terminal of the upper switch 161 and a second terminal of the lower switch 163, as shown in FIG. 3.

The flash memory with the 3-dimensional architecture solves some issues of the conventional flash memory with a 2-dimensional architecture, but also results in some other issues. Some common issues include data retention characteristics, read disturbance, or program disturbance, which may result in variation of voltage distributions of memory cells and consequently reduce the reliability. The flash memory with the 2-dimensional architecture and the flash memory with the 3-dimensional architecture have different characteristics. These different characteristics have different influences on the durability of NAND flash memory. A main difference is that the NAND flash memory with the 3-dimensional architecture has greater wordline-to-wordline variation. Distributions of error bits among different layers of wordlines are not uniform.

FIG. 4 is a schematic view illustrating a distribution of data voltage of the flash memory 100 with the 3-dimensional architecture shown in FIGS. 1 to 3. Here, it is assumed that the floating gate transistors 162_1, 162_2, 162_3, 162_4, and 162_5 are in multi-level cell (MLC) structures. A horizontal axis of FIG. 4 represents voltage, and a vertical axis of FIG. 4 represents quantity of distribution. A read voltage (also referred to as threshold voltage) of the MLC flash memory includes an upper page read voltage VtU1, an upper page read voltage VtU2, and a lower page read voltage VtL. Taking the wordline 130_1 (details of the rest wordlines 130_2, 130_3, 130_4, 130_5 may be inferred by referring to the descriptions of the wordline 130_1) as an example, FIG. 4 illustrates four normal distribution curves 401, 402, 403, and 404. The normal distribution curve 401 shows that a memory cell (floating gate transistor) connected with the wordline 130_1 has a data voltage distribution of a memory cell whose upper page data is "1" and lower page data is "1". The normal distribution curve 402 shows that the memory cell (floating gate transistor) connected with the wordline 130_1 has a data voltage distribution of a memory cell whose upper page data is "0" and lower page data is "1". The normal distribution curve 403 shows that the memory cell (floating gate transistor) connected with the wordline 130_1 has a data voltage distribution of a memory cell whose upper page data is "0" and lower page data is "0". The normal distribution curve 404 shows that the memory cell (floating gate transistor) connected with the wordline 130_1 has a data voltage distribution of a memory cell whose upper page data is "1" and lower page data is "0".

Referring to FIG. 4, when a data voltage of a memory cell is lower than the read voltage VtL, the lower page data of the memory cell may be determined as "1". When the data voltage of the memory cell is greater than the read voltage VtL, the lower page data of the memory cell may be determined as "0". When the data voltage of the memory cell is lower than the read voltages VtU1 and VtU2, or the data voltage of the memory cell is greater than the read voltages VtU1 and VtU2, the upper page data of the memory cell may be determined as "1". When the data voltage of the memory cell is between the read voltage VtU1 and VtU2, the upper page data of the memory cell may be determined as "0". Accordingly, based on the read voltages VtU1, VtU2, and VtL, the data voltage of the memory cell may be converted into corresponding data.

Due to factors such as data retention characteristics, read disturbance, or program disturbance, the voltage distribution of the memory cell may change and thus reduce the reliability. The variations of voltage distributions of wordlines at different layers may differ. If the data voltage output by the memory cell becomes lower or higher, the normal distribution curve may be shifted. For example, as shown in FIG. 4, an extent to which the normal distribution curve of the wordline 130_2 shifts rightward is greater than an extent to which the normal distribution curve of the wordline 130_1 shifts rightward, and an extent to which the normal distribution curve of the wordline 130_3 shifts rightward is greater than an extent to which the normal distribution curve of the wordline 130_2 shifts rightward. Shifting of the data voltage may result in more error bits in corresponding data that are read or converted.

The conventional NAND flash memory controller adopts error checking and correcting (ECC) solutions such as a Bose-Chaudhuri-Hocquengh (BCH) code algorithm or a low density parity check (LDPC) code algorithm. The conventional controller adopts a fixed parity bit length to correct data having error bits. The conventional ECC solutions work well in the flash memory with the 2-dimensional architecture, as the flash memory with the 2-dimensional architecture has uniform voltage distributions. However, the conventional ECC solutions do not work effectively in the NAND flash memory with the 3-dimensional architecture, because the error bits among different wordlines are not distributed uniformly. If the same ECC solution (with the same parity bit length) is used for each wordline in the NAND flash memory with the 3-dimensional architecture, a parity bit length of a wordline with a smaller shift of data voltage is over-configured, and the performance of the storage device may thus be affected.

SUMMARY OF THE INVENTION

The invention provides a controller device and an operation method for a non-volatile memory with a 3-dimensional architecture capable of reducing over-configuration of parity bit length.

An embodiment of the invention provides a controller device for a non-volatile memory with a 3-dimensional architecture. The controller device includes an error checking and correcting (ECC) circuit and a controller. The controller is coupled to the non-volatile memory with the 3-dimensional structure and the ECC circuit. The controller may access a target wordline of the non-volatile memory with the 3-dimensional structure based on a physical address. The controller groups a plurality of wordlines of the non-volatile memory with the 3-dimensional structure into a plurality of wordline groups, wherein different wordline groups have different codeword structures. The controller controls the ECC circuit according to the codeword structure of the wordline group of the target wordline, and the ECC circuit generates a codeword to be stored in the target wordline or check a codeword from the target wordline under control of the controller.

An embodiment of the invention provides an operation method for a non-volatile memory with a 3-dimensional architecture. The operation method includes: grouping, by a controller, a plurality of wordlines of the non-volatile memory with the 3-dimensional architecture into a plurality of wordline groups, wherein different wordline groups have different codeword structures; accessing, by the controller, a target wordline of the non-volatile memory with the 3-dimensional architecture based on a physical address, wherein the controller controls an error checking and correcting circuit based on a codeword structure of the wordline group of the target wordline, and the error checking and correcting circuit generates a codeword to be stored in the target wordline under control of the controller or checks a codeword from the target wordline under control of the controller.

Based on the above, the controller device and the operation method of the non-volatile memory with the 3-dimensional architecture according to the embodiments of the invention are able to adaptively assign the codeword structures with respectively different parity bit lengths to different wordline groups of the non-volatile memory with the 3-dimensional architecture, and the controller device may access the target wordline based on the codeword structure of the wordline group of the target wordline. Thus, the controller device of the non-volatile memory with the 3-dimensional architecture is able to reduce over-configuration of parity bit length.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
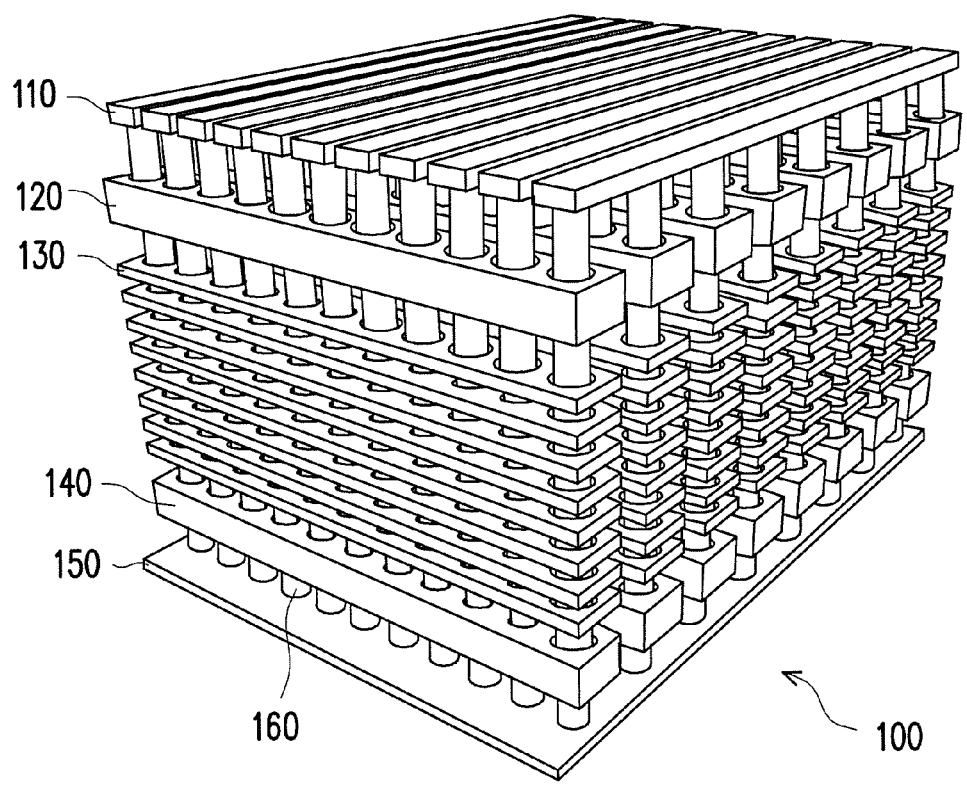
FIG. 1 is a schematic perspective view illustrating a flash memory with a 3-dimensional architecture.
Figure 1:
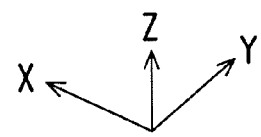

Reference will now be made in detail to the present preferred embodiments of the invention, examples of which are illustrated in the accompanying drawings. Wherever possible, the same reference numbers are used in the drawings and the description to refer to the same or like parts.

Throughout the specification (including claims) of the invention, the term "couple" (or "connect") may refer to any direct or indirect connection means. For example, if it is described that a first device is coupled (or connected) to a second device, it shall be interpreted that the first device may be directly connected to the second device, or the first device may be indirectly connected to the second device through another device or by a connection means. Moreover, elements/components/steps with same reference numerals represent same or similar parts in the drawings and embodiments. Descriptions related to elements/components/steps referred to with same reference numerals or described with same terms in different embodiments may be referred to each other.

Figure 5:
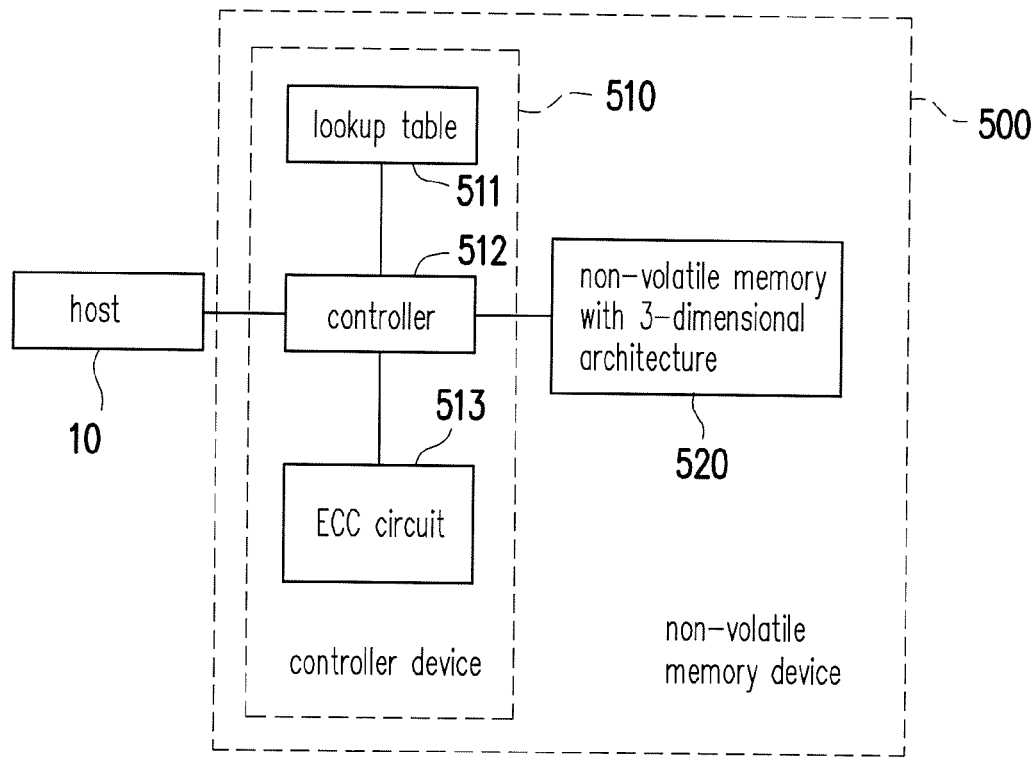
FIG. 5 is a schematic circuit block view illustrating a non-volatile memory device according to an embodiment of the invention.

FIG. 5 is a schematic circuit block view illustrating a non-volatile memory device 500 according to an embodiment of the invention. Based on design requirements, the non-volatile memory device 500 may be a flash drive, a solid state drive (SSD), or other storage devices. The non-volatile memory device 500 may be coupled to a host 10. The host 10 may be a computer, a handheld phone, a multimedia player, a camera, or other electronic devices. When the host 10 sends a read command to the non-volatile memory device 500, the non-volatile memory device 500 may return corresponding data to the host 10 based on an address in the read command.

Figures 2, 3:
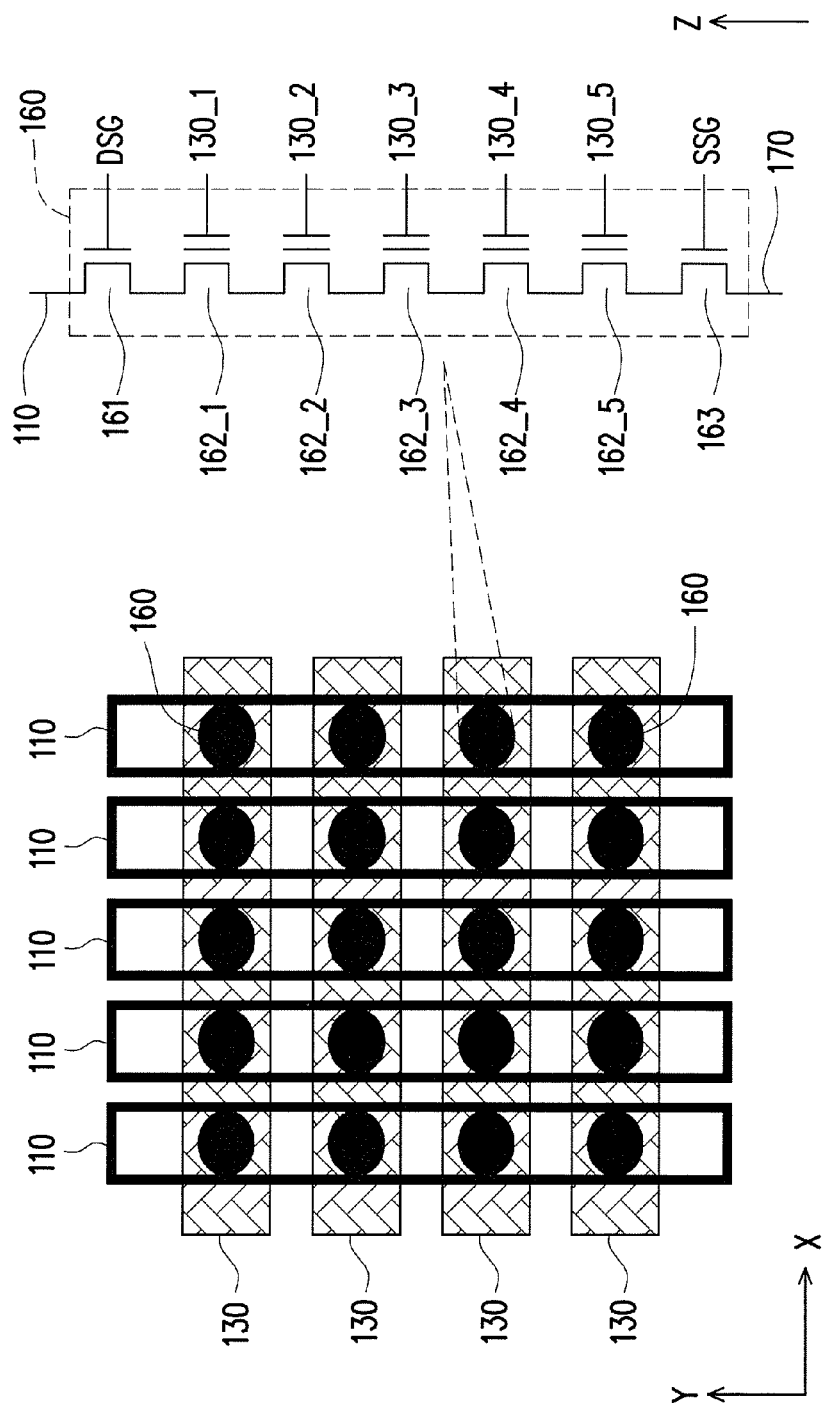
FIG. 2 is a schematic top view illustrating the flash memory with the 3-dimensional architecture shown in FIG. 1.
FIG. 3 is a equivalent circuit diagram of a channel shown in FIGS. 1 and 2.
Figure 4:
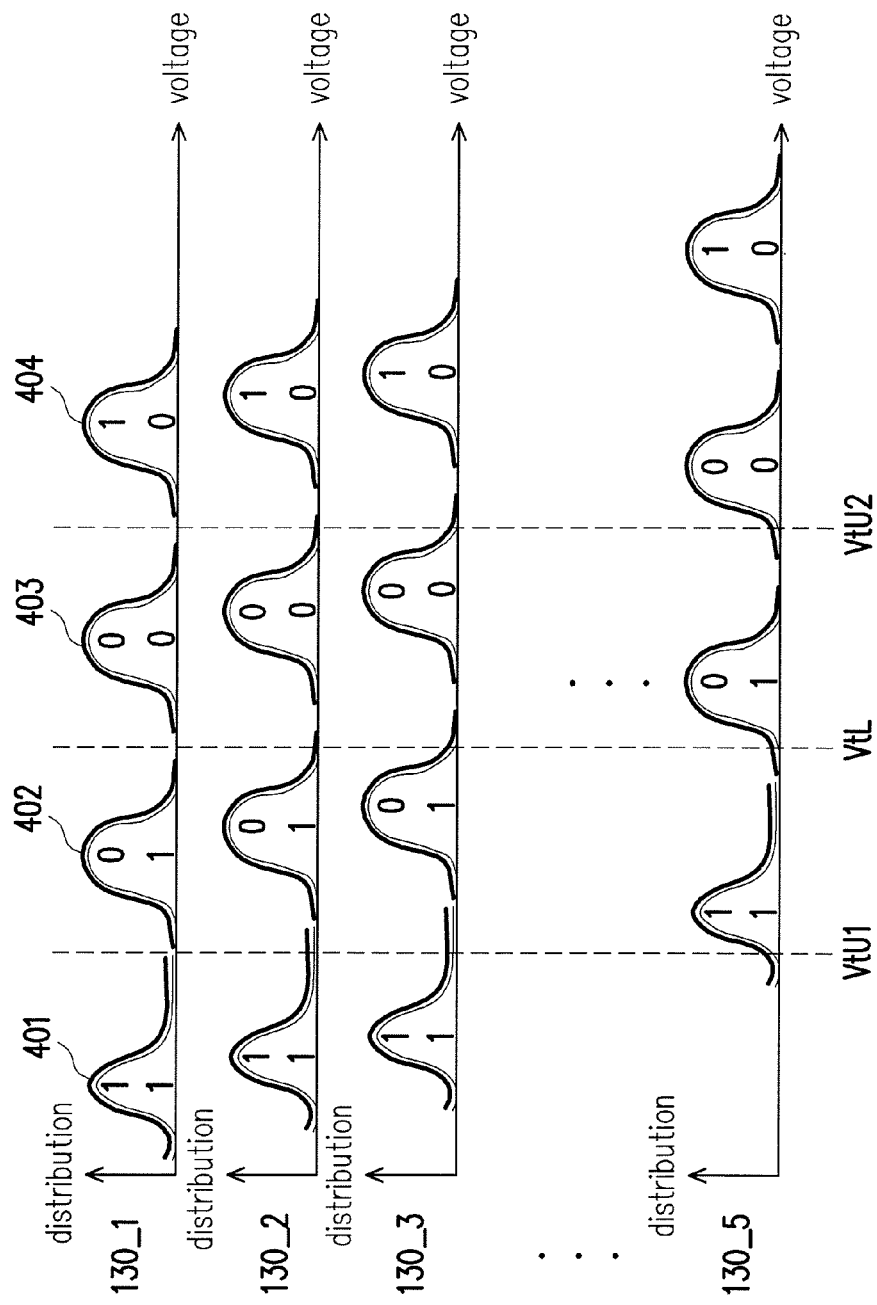
FIG. 4 is a schematic view illustrating a distribution of data voltage of the flash memory with the 3-dimensional architecture shown in FIGS. 1 to 3.

In the embodiment shown in FIG. 5, the non-volatile memory device 500 includes a controller device 510 and a non-volatile memory 520 with a 3-dimensional architecture. Based on design requirements, the non-volatile memory 520 with the 3-dimensional architecture may be an NAND flash memory or other non-volatile storage circuits/elements. In some embodiments, the non-volatile memory 520 with the 3-dimensional architecture may be the flash memory 100 with the 3-dimensional architecture shown in FIGS. 1 to 3. The controller device 510 is coupled to the non-volatile memory 520 with the 3-dimensional architecture. When the host 10 sends a read command, the controller device 510 may address the non-volatile memory 520 with the 3-dimensional architecture based on the read command, so as to read corresponding data in the non-volatile memory 520 with the 3-dimensional architecture and return the corresponding data to the host 10.

In the embodiment shown in FIG. 5, the controller device 510 includes a lookup table 511, a controller 512, and an error checking and correcting (ECC) circuit 513. The lookup table 511 is coupled to the controller 512. The lookup table 511 may record corresponding relations among a plurality of wordlines, a plurality of wordline groups, and a plurality of codeword structures of the non-volatile memory 520 with the 3-dimensional architecture. How the lookup table 511 is implemented may be determined based on design requirements. For example, in some embodiments, the lookup table 511 may be stored in the non-volatile memory 520 with the 3-dimensional architecture. In some other embodiments, the lookup table 511 may be stored in another independent non-volatile memory (not shown). In yet another embodiment, the chip manufacturer may establish the lookup table 512 in advance and/or store the lookup table 511 in the controller 512 as firmware. In still another embodiment, the lookup table 511 may be stored in a volatile memory (not shown). The controller 512 is coupled to the non-volatile memory 520 with the 3-dimensional architecture and the ECC circuit 513. The controller 512 may convert a logical address of an access command of the host 10 into a physical address. The controller 512 may access a target wordline of the non-volatile memory 520 with the 3-dimensional architecture based on the physical address.

Figure 6:
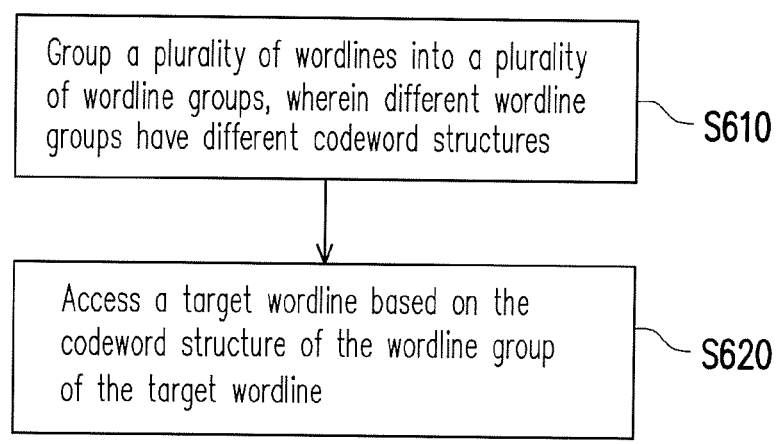
FIG. 6 is a schematic flowchart illustration an operation method of a non-volatile memory 520 with a 3-dimensional architecture according to an embodiment of the invention.

FIG. 6 is a schematic flowchart illustration an operation method of a non-volatile memory 520 with a 3-dimensional architecture according to an embodiment of the invention. Referring to FIGS. 5 and 6, at Step S610, the controller 512 may group a plurality of wordlines of the non-volatile memory 520 with the 3-dimensional architecture into a plurality of wordline groups based on the lookup table 511. Codeword structures of the different wordline groups have different parity bit lengths. At Step S620, the controller 512 accesses the target wordline of the non-volatile memory 520 with the 3-dimensional architecture based on the physical address. In addition, the controller 512 follow the lookup table to find out the codeword structure of the wordline group of the target wordline, so as to control the ECC circuit 513, and the ECC circuit 513 generates a codeword to be stored in the target wordline under control of the controller 512 or checks the codeword of the target wordline under control of the controller 512. In other words, based on the lookup table, the controller 512 may assign codeword structures with different parity bit lengths to different wordline groups of the non-volatile memory 520 with the 3-dimensional architecture, and the controller device 510 may access the target wordline based on the codeword structure of the wordline group of the target wordline. Since a wordline with a smaller shift of data voltage may be adaptively assigned with a codeword structure having a smaller parity bit length, and a wordline with a greater shift of data voltage may be adaptively assigned with a codeword structure with a greater parity bit length, the controller device 510 of the non-volatile memory 520 with the 3-dimensional architecture is able to reduce over-configuration of parity bit length. Generally speaking, a wordline closer to a power supply source (not shown) of the channel 160 has a smaller shift of data voltage, and a wordline more distant from the power supply source (not shown) of the channel 160 has a greater shift of data voltage. Therefore, in another embodiment, the controller 512 assigns a codeword structure with a smaller parity bit length to a wordline closer to the power supply source (not shown) of the channel 160, and assigns a codeword structure with a greater parity bit length to a wordline more distant from the power supply source (not shown) of the channel 160.

Figure 7:
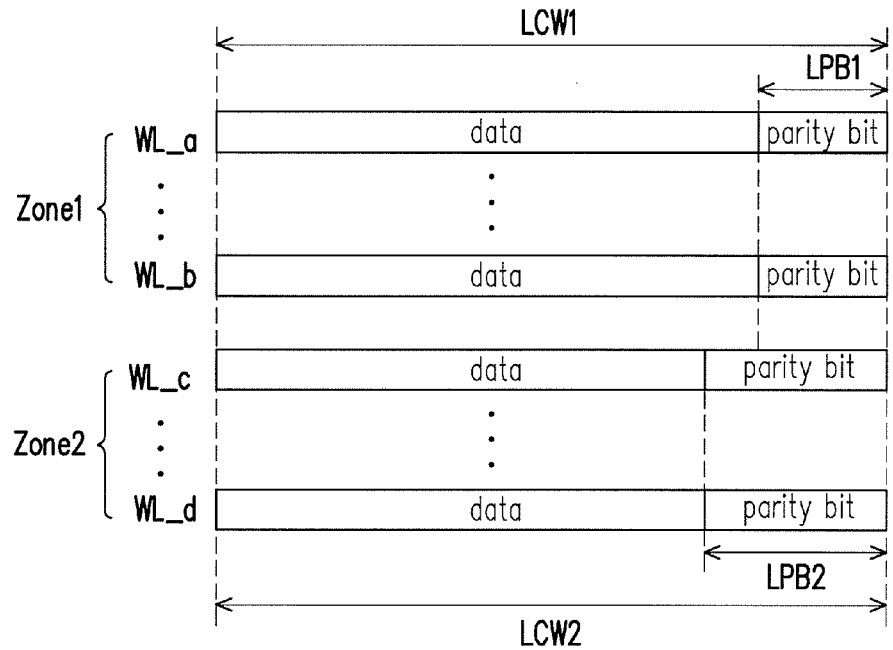
FIG. 7 is a schematic view illustrating a codeword structure according to an embodiment of the invention.

FIG. 7 is a schematic view illustrating a codeword structure according to an embodiment of the invention. In the embodiment shown in FIG. 7, wordlines WL_a . . . WL_b of the non-volatile memory 520 with the 3-dimensional architecture are grouped into a wordline group Zone1, and wordlines WL_c . . . WL_d of the non-volatile memory 520 with the 3-dimensional architecture are grouped into a wordline group Zone 2, wherein a, b, c, and d are integers. a, b, c, and d may be determined based on design requirements. The codeword structures of different wordline groups have the same codeword length, but the codeword structures of different wordline groups have different parity bit lengths. In the embodiment shown in FIG. 7, a codeword length LCW1 of the codeword structure of the wordline group Zone1 is the same as a codeword length LCW2 of the codeword structure of the wordline group Zone2, but a parity bit length LPB1 of the codeword structure of the wordline group Zone1 is different from a parity bit length LPB2 of the codeword structure of the wordline group Zone2.

Figure 8:
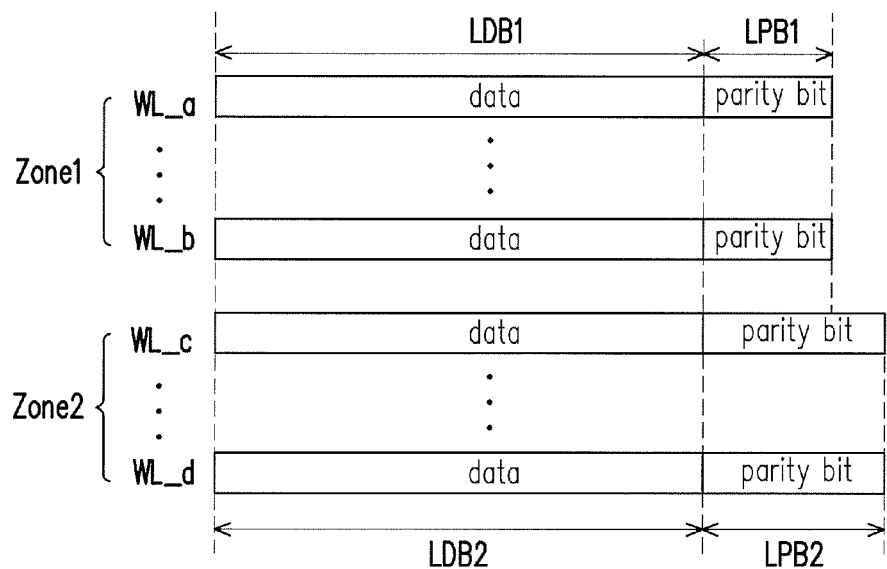
FIG. 8 is a schematic view illustrating a codeword structure according to another embodiment of the invention.

FIG. 8 is a schematic view illustrating a codeword structure according to another embodiment of the invention. In the embodiment shown in FIG. 8, the wordlines WL_a . . . WL_b of the non-volatile memory 520 with the 3-dimensional architecture are grouped into the wordline group Zone1, and the wordlines WL_c . . . WL_d of the non-volatile memory 520 with the 3-dimensional architecture are grouped into the wordline group Zone 2. The codeword structures of different wordline groups have the same data bit length, but the codeword structures of different wordline groups have different parity bit lengths. In the embodiment shown in FIG. 8, a data bit length LDB1 of the codeword structure of the wordline group Zone1 is the same as a data bit length LDB2 of the codeword structure of the wordline group Zone2, but the parity bit length LPB1 of the codeword structure of the wordline group Zone1 is different from the parity bit length LPB2 of the codeword structure of the wordline group Zone2.

Figure 9:
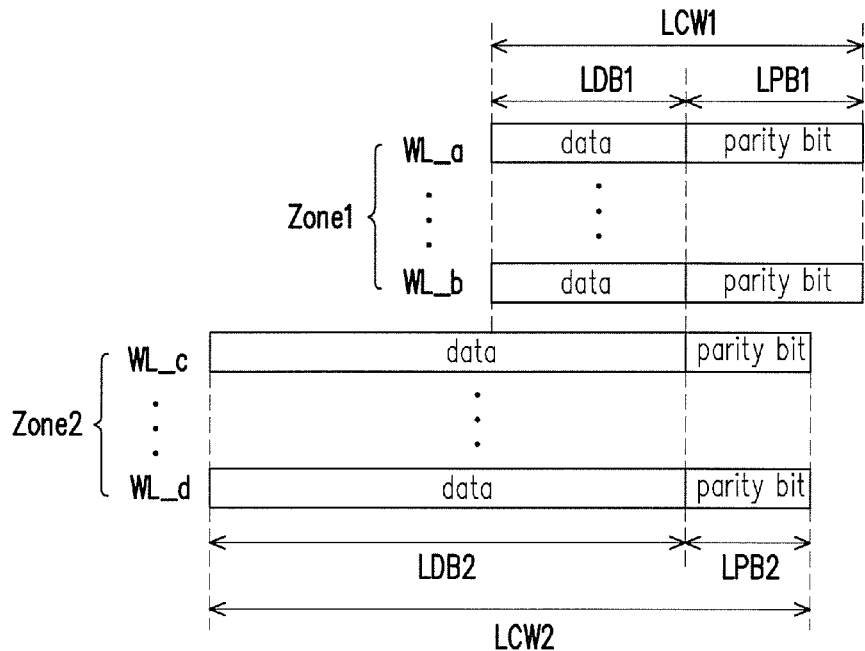
FIG. 9 is a schematic view illustrating a codeword structure according to yet another embodiment of the invention.

FIG. 9 is a schematic view illustrating a codeword structure according to yet another embodiment of the invention. In the embodiment shown in FIG. 9, the wordlines WL_a . . . WL_b of the non-volatile memory 520 with the 3-dimensional architecture are grouped into the wordline group Zone1, and the wordlines WL_c . . . WL_d of the non-volatile memory 520 with the 3-dimensional architecture are grouped into the wordline group Zone 2. The codeword structures of different wordline groups have different codeword lengths, different data bit lengths, and different parity bit lengths. In the embodiment shown in FIG. 9, the codeword length LCW1 of the codeword structure of the wordline group Zone1 is different from the codeword length LCW2 of the codeword structure of the wordline group Zone2, the data bit length LDB1 of the codeword structure of the wordline group Zone1 is the different from the data bit length LDB2 of the codeword structure of the wordline group Zone2, and the parity bit length LPB1 of the codeword structure of the wordline group Zone1 is different from the parity bit length LPB2 of the codeword structure of the wordline group Zone2. Specifically, in the embodiment shown in FIG. 9, the codeword structure of the wordline group Zone1 may have the smaller data bit length LDB1 and the greater parity bit length LPB1, so the wordlines included in the wordline group Zone 1 may be wordlines whose reading performance is less preferable (e.g., wordlines with more error bits). The codeword structure of the wordline group Zone 2 may have the greater data bit length LDB2 (LDB2 being greater than LDB1) and the smaller parity bit length LPB2 (LPB2 being smaller than LPB1), so the wordlines included in the wordline group Zone 2 may be wordlines whose reading performance is more preferable (e.g., wordlines with fewer error bits).

Error correction involves a ratio between parity bit length and data bit length. A higher ratio indicates a better error correction ability. Thus, for a wordline group whose reading performance is more preferable, the codeword structure of the wordline group requires a lower error correction ability, namely a lower ratio between parity bit length and data bit length. The lower ratio means fewer parity bits are used to protect more data bits. For a bad wordline group (wordlines with more error bits), the codeword structure thereof needs a higher ratio for a better error correction performance. The higher ratio means more parity bits are used to protect fewer data bits.

Figure 10:
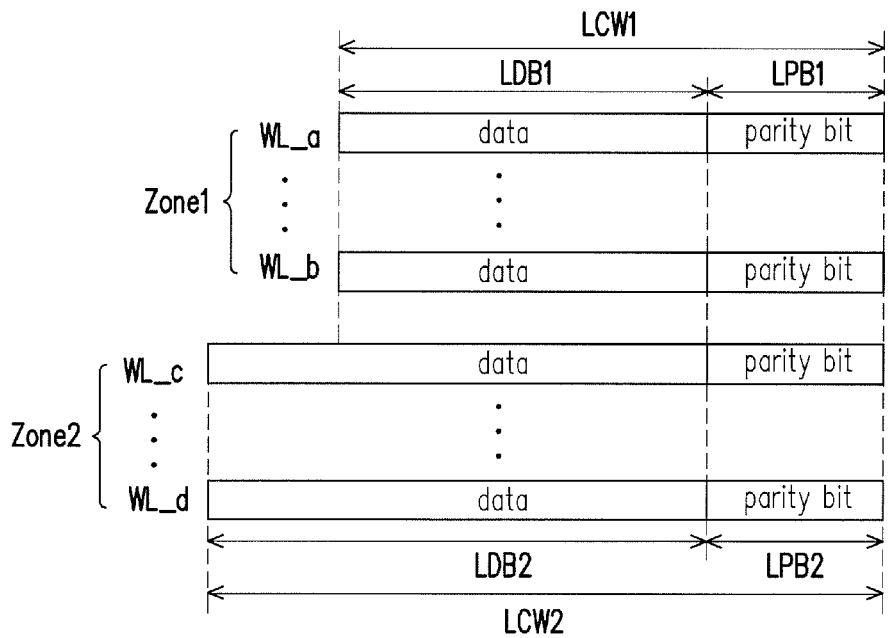
FIG. 10 is a schematic view illustrating a codeword structure according to still another embodiment of the invention.

FIG. 10 is a schematic view illustrating a codeword structure according to still another embodiment of the invention. In the embodiment shown in FIG. 10, the wordlines WL_a . . . WL_b of the non-volatile memory 520 with the 3-dimensional architecture are grouped into the wordline group Zone1, and the wordlines WL_c . . . WL_d of the non-volatile memory 520 with the 3-dimensional architecture are grouped into the wordline group Zone 2. The codeword structures of different wordline groups have different codeword lengths, and the codeword structures of different wordline groups have different data bit lengths. The codeword structures of different wordline groups have the same parity bit length. In the embodiment shown in FIG. 10, the codeword length LCW1 of the codeword structure of the wordline group Zone1 is different from the codeword length LCW2 of the codeword structure of the wordline group Zone2, but the data bit length LDB1 of the codeword structure of the wordline group Zone1 is different from the data bit length LDB2 of the codeword structure of the wordline group Zone2. The parity bit length LPB1 of the codeword structure of the wordline group Zone1 is the same as the parity bit length LPB2 of the codeword structure of the wordline group Zone2. Specifically, in the embodiment shown in FIG. 10, assuming that the parity bit length is the same, the codeword structure of the wordline group Zone1 may use the smaller data bit length LDB1 for a better error correction ability. Thus, the codeword structure of the wordline group Zone1 does not waste/increase parity space. Consequently, the wordlines included in the wordline group Zone1 may be wordlines whose reading performance is less preferable (e.g., wordlines with more error bits). The codeword structure of the wordline group Zone2 may use the greater data bit length LDB2 (LDB2 being greater than LDB1). Thus, assuming that the parity bit lengths of the wordline groups Zone1 and Zone2 are the same, the wordlines included in the wordline group Zone 2 may be wordlines whose reading performance is more preferable (e.g., wordlines with fewer error bits). The codeword structure of the wordline group Zone2 may have the same parity bit length but more data bits. Compared with the codeword structure of the wordline group Zone1, the codeword structure of the wordline group Zone2 has a weaker error correction ability.

In some embodiments, Step S610 of FIG. 6 may include operations in the following. In the lookup table 511, the wordlines may be statically grouped into the wordline groups based on the number of layers of the wordlines in the non-volatile memory 520 with the 3-dimensional architecture. Here, the wordline groups respectively have different parity bit lengths. In an embodiment, the parity bit length of the wordline group at a lower layer of the non-volatile memory 520 with the 3-dimensional architecture is greater than the parity bit length of the wordline group at a higher layer of the non-volatile memory 520 with the 3-dimensional architecture. In another embodiment, the parity bit length of the wordline group at a lower layer of the non-volatile memory 520 with the 3-dimensional architecture is smaller than the parity bit length of the wordline group at a higher layer of the non-volatile memory 520 with the 3-dimensional architecture.

Generally speaking, the wordline closer to the power supply source (not shown) of the channel 160 has a smaller shift of data voltage, and the wordline more distant from the power supply source (not shown) of the channel 160 has a greater shift of data voltage. Thus, in yet another embodiment, the controller 512 may statically group the wordlines 130 into the wordline groups based on distances between the wordlines 130 and the power supply source (not shown). The parity bit length of the wordline group closer to the power supply source (not shown) of the channel 160 in the non-volatile memory 520 with the 3-dimensional architecture is smaller than the parity length of the wordline group more distant from the power supply source (not shown) of the channel 160. In other words, the controller 512 may assign a codeword structure with a smaller parity bit length to the wordline group closer to the power supply source (not shown) of the channel 160, and assign a codeword structure with a greater parity bit length to the wordline group more distant from the power supply source (not shown) of the channel 160.

Figure 11:
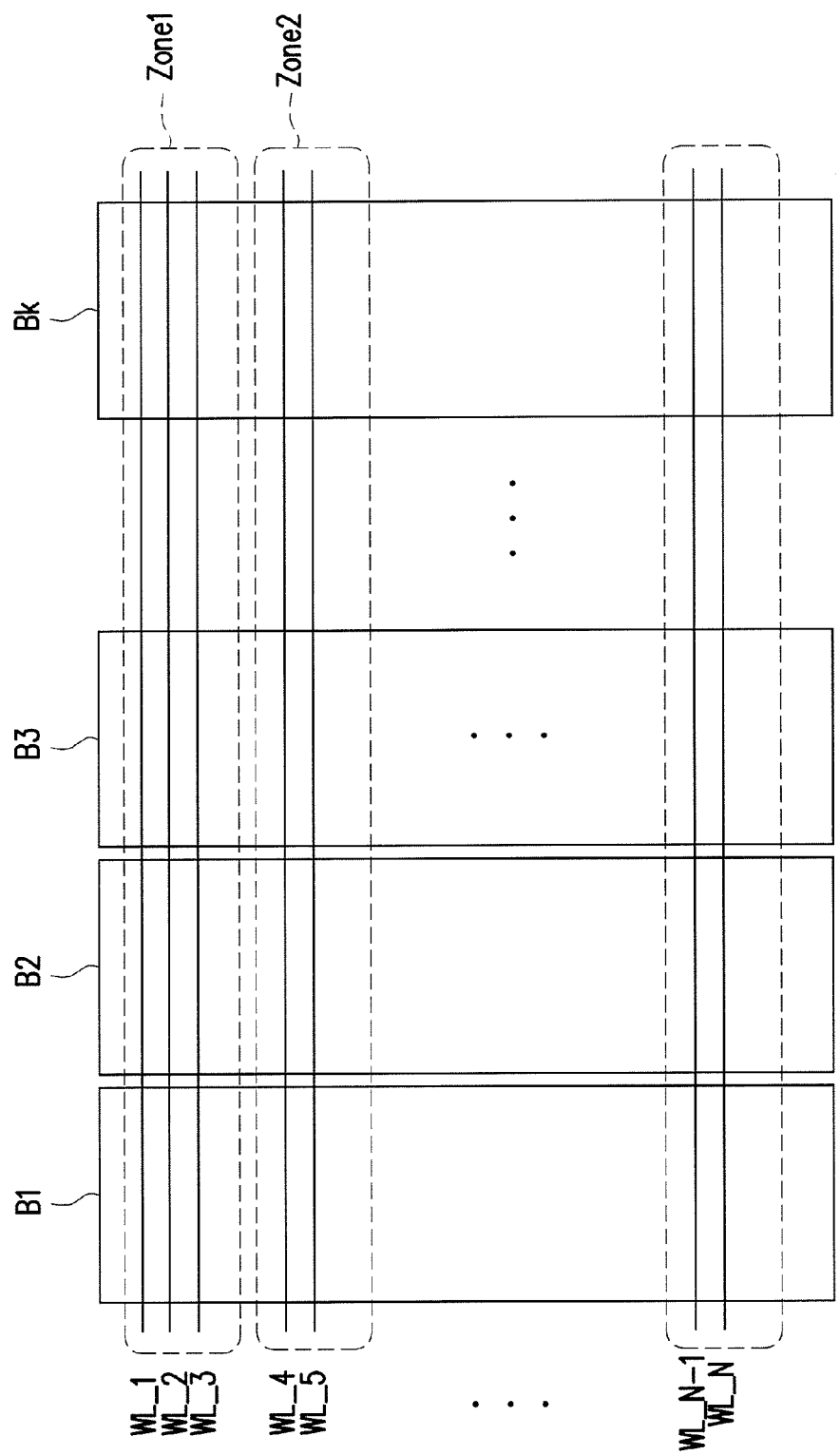
FIG. 11 is a schematic view illustrating statically grouping a plurality of wordlines into a plurality of wordline groups according to an embodiment of the invention.

For example, FIG. 11 is a schematic view illustrating statically grouping a plurality of wordlines into a plurality of wordline groups according to an embodiment of the invention. FIG. 11 illustrates the non-volatile memory 520 with the 3-dimensional architecture having physical blocks B1, B2, B3, . . . , Bk, and wordlines WL_1, WL_2, WL_3, WL_4, WL_5, . . . , WL_N-1, and WL_N, wherein N is an integer. N may be determined based on design requirements. The same wordline crosses a plurality of the physical blocks, as shown in FIG. 11. In the embodiment shown in FIG. 11, the controller 512 may refer to the lookup table 511 and statically group the wordlines WL_1 to WL_N into the wordline groups based on the number of layers in the non-volatile memory 520 with the 3-dimensional architecture. For example, the wordlines WL_1, WL_2, and WL_3 of the non-volatile memory 520 with the 3-dimensional architecture are grouped into the wordline group Zone1, and the wordlines WL_4 and WL5 of the non-volatile memory 520 with the 3-dimensional architecture are grouped into the wordline group Zone2. The parity bit length of the wordline group Zone1 at a lower layer of the non-volatile memory 520 with the 3-dimensional architecture is greater than the parity bit length of the wordline group Zone2 at a higher layer of the non-volatile memory 520 with the 3-dimensional architecture. Details of other wordline groups shown in FIG. 11 may be inferred by referring to relevant descriptions of the wordline group Zone1 and the wordline group Zone2, and are thus not repeated in the following. In an embodiment of static grouping, the number of wordlines in each wordline group may be the same or different. In an embodiment of static grouping, the wordlines in each wordline group are wordlines adjacent to each other.

Figure 12:
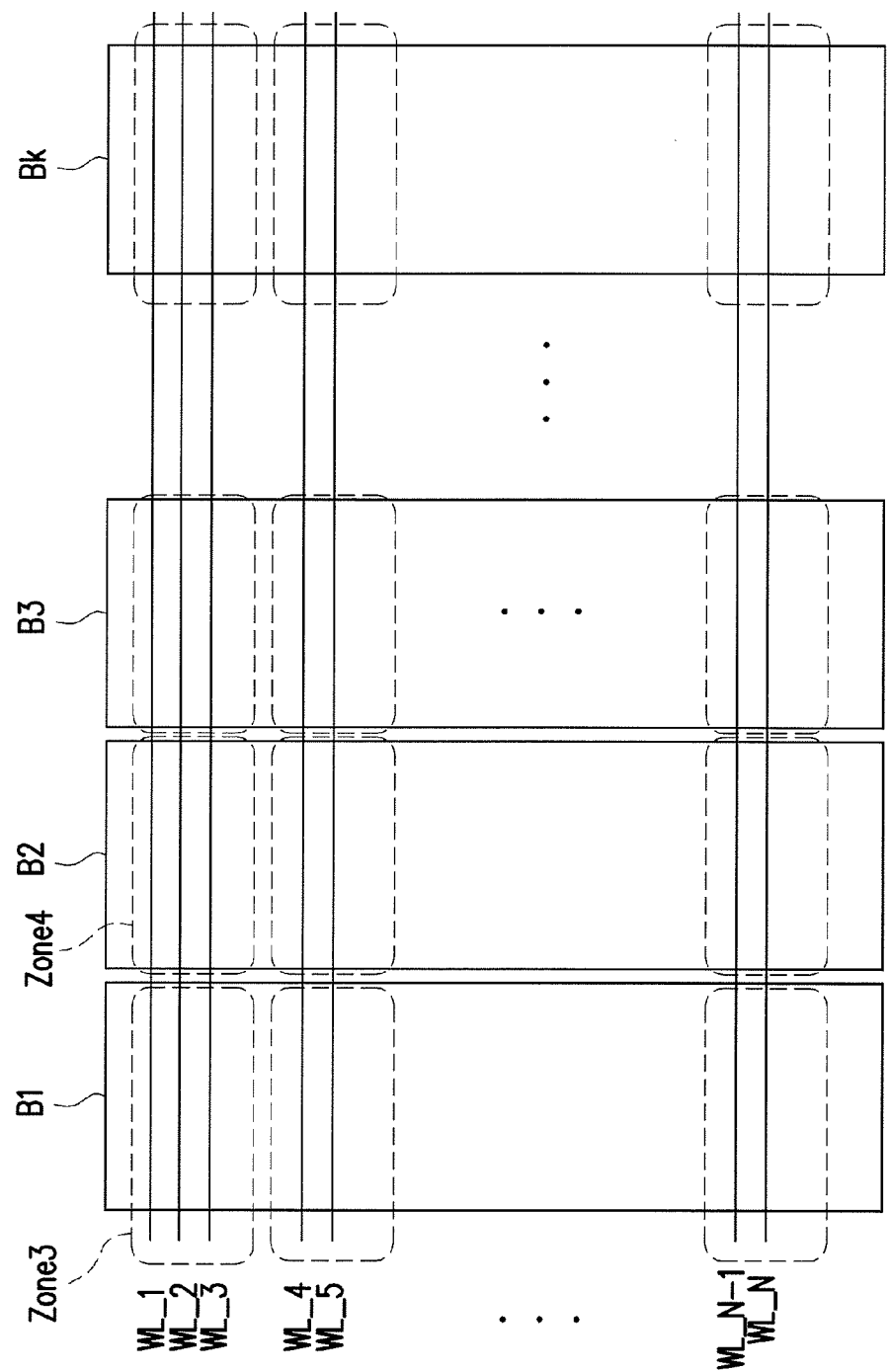
FIG. 12 is a schematic view illustrating statically grouping a plurality of wordlines into a plurality of wordline groups according to another embodiment of the invention.

FIG. 12 is a schematic view illustrating statically grouping a plurality of wordlines into a plurality of wordline groups according to another embodiment of the invention. Details of the embodiment shown in FIG. 12 may be inferred by referring to relevant descriptions of FIG. 11, and are thus not repeated in the following. What differs from the embodiment shown in FIG. 11 is that, in the embodiment shown in FIG. 12, the wordlines WL_1 to WL_N are further grouped based on physical blocks in addition to being grouped based on the number of layers in the non-volatile memory 520 with the 3-dimensional architecture. For example, some of the wordlines WL_1, WL_2, and WL_3 of the non-volatile memory 520 with the 3-dimensional architecture in the physical block B1 are grouped into a wordline group Zone3, and some of the wordlines WL_1, WL_2, and WL_3 of the non-volatile memory 520 with the 3-dimensional architecture in the physical block B2 are grouped into a wordline group Zone4. Details of other wordline groups shown in FIG. 12 may be inferred by referring to relevant descriptions of the wordline group Zone3 and the wordline group Zone4, and are thus not repeated in the following.

Figure 13:
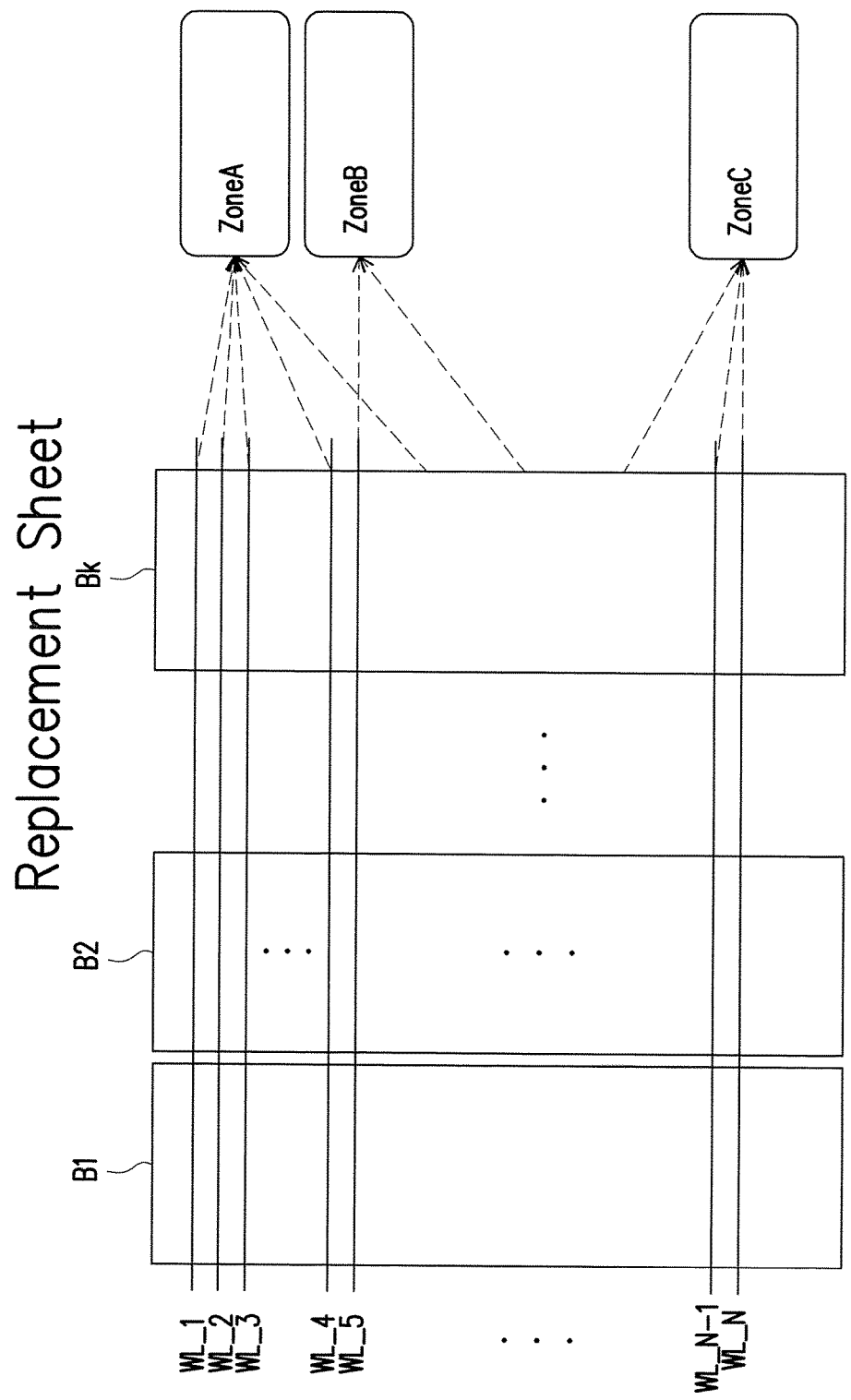
FIG. 13 is a schematic view illustrating dynamically grouping a plurality of wordlines into a plurality of wordline groups according to yet another embodiment of the invention.

In some other embodiments, Step S610 may include operations in the following. The controller 512 may dynamically group the wordlines into the wordline groups based on error bit counts of the wordlines. In addition, the parity bit length of a wordline group having a greater error bit count is greater than the parity bit length of a wordline group having a lower error bit count. For example, FIG. 13 is a schematic view illustrating dynamically grouping a plurality of wordlines into a plurality of wordline groups according to still another embodiment of the invention. FIG. 13 illustrates the non-volatile memory 520 with the 3-dimensional architecture having the physical blocks B1, B2, . . . , Bk, and the wordlines WL_1, WL_2, WL_3, WL_4, WL_5, . . . , WL_N-1, and WL_N, wherein N is an integer. N may be determined based on design requirements. The same wordline crosses a plurality of the physical blocks, as shown in FIG. 13. In the embodiment shown in FIG. 13, the controller 512 may dynamically group the wordlines WL_1 to WL_N into the wordline groups based on error bit counts of the wordlines WL_1 to WL_N. For example, if the error bit counts of the wordlines WL_1, WL_2, WL_3, and WL_4 and some other wordlines fall within a first range, the controller 512 may dynamically group the wordlines (e.g., the wordlines WL_1, WL_2, WL_3, and WL_4) whose error bit counts fall within the first range into a wordline group ZoneA. If the error bit counts of the wordline WL_5 and some other wordlines fall within a second range, the controller 512 may dynamically group the wordlines (e.g., the wordline WL_5) whose error bit counts fall within the second range into a wordline group ZoneB. Following the same principle, the controller 512 may dynamically group the wordlines (e.g., wordlines WL_N-1 and WL_N) whose error bit counts fall within a third range into a wordline group ZoneC. The parity bit length of the wordline group ZoneB having a greater error bit count is greater than the parity bit length of the wordline group ZoneA having a lower error bit count, and the parity bit length of the wordline group Zone C having a greater error bit count is greater than the parity bit length of the wordline group ZoneB having a lower error bit count. However, it should be noted that the above is merely an example for an illustrative purpose. The controller 512 may dynamically group the wordlines in a background operation of the non-volatile memory device 500 and update the lookup table 511, such that the ECC circuit 513 may check wordline data bits with corresponding wordline parity bits based on each wordline group. In an embodiment of dynamic grouping, the number of wordlines in each wordline group may be the same or different. In an embodiment of dynamic grouping, the wordlines in each wordline group are wordlines separated from each other.

It should be noted that, in different scenarios of application, relevant functions of the controller device 510, the lookup table 511, the controller 512 and/or the ECC circuit 513 may be implemented in the form of software, firmware, or hardware by adopting conventional programming languages (e.g., C or C++), hardware description languages (e.g., Verilog HDL or VHDL), or other suitable programming languages. The software (or firmware) capable of carrying out the relevant functions may be arranged in any conventional computer-accessible media, such as magnetic tapes, semiconductor memories, magnetic disks, compact disks (e.g., CD-ROM or DVD-ROM), or the software (or firmware) may be transmitted via the Internet, wired communication, wireless communication, or other communication media. The software (or firmware) may be stored in the computer-accessible media, so that the processor of the computer may access/execute programming codes of the software (or firmware). In addition, the device and method according to the embodiments of the invention may be carried out through combination of hardware and software.

In view of the foregoing, the controller device 510 according to the embodiments of the invention is capable of adaptively assign the codeword structures with respectively different parity bit lengths to different wordline groups of the non-volatile memory 520 with the 3-dimensional architecture. The controller device 510 may access the target wordline based on the codeword structure of the wordline group of the target wordline. Thus, the controller device 510 of the non-volatile memory 520 with the 3-dimensional architecture is able to reduce over-configuration of parity bit length.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A controller device for a non-volatile memory with a 3-dimensional architecture, comprising:
an error checking and correcting (ECC) circuit; and
a controller, coupled to the non-volatile memory with the 3-dimensional architecture and the ECC circuit, and configured to access a target wordline of the non-volatile memory with the 3-dimensional architecture based on a physical address, wherein the controller groups a plurality of wordlines of the non-volatile memory with the 3-dimensional architecture into a plurality of wordline groups, different wordline groups have different codeword structures, the controller controls the ECC circuit based on the codeword structure of the wordline group of the target wordline, and the ECC circuit generates a codeword to be stored in the target wordline under control of the controller or checks the codeword from the target wordline under control of the controller,
wherein the controller statically groups the wordlines into the wordline groups based on distances between the wordlines and a power supply source, the controller assigns a codeword structure with a smaller parity bit length to a wordline group of the wordline groups that is closer to the power supply source, and assigns a codeword structure with a greater parity bit length to a wordline group of the wordline groups that is more distant from the power supply source.

2. The controller device as claimed in claim 1, further comprising:
a lookup table, coupled to the controller and configured to record corresponding relations among the wordlines, the wordline groups, and the codeword structures of the non-volatile memory with the 3-dimensional architecture.

3. The controller device as claimed in claim 2, wherein the controller groups the wordlines into the wordline groups based on the lookup table, and the codeword structures of different codeword groups have different parity bit lengths.

4. The controller device as claimed in claim 1, wherein in one of the wordline groups, the wordlines are adjacent to each other.

5. A controller device for a non-volatile memory with a 3-dimensional architecture, comprising:
an error checking and correcting (ECC) circuit; and
a controller, coupled to the non-volatile memory with the 3-dimensional architecture and the ECC circuit, and configured to access a target wordline of the non-volatile memory with the 3-dimensional architecture based on a physical address, wherein the controller groups a plurality of wordlines of the non-volatile memory with the 3-dimensional architecture into a plurality of wordline groups, different wordline groups have different codeword structures, the controller controls the ECC circuit based on the codeword structure of the wordline group of the target wordline, and the ECC circuit generates a codeword to be stored in the target wordline under control of the controller or checks the codeword from the target wordline under control of the controller,
wherein the controller statically groups the wordline into the wordline groups based on the number of layers of the wordlines in the non-volatile memory with the 3-dimensional architecture, and a parity bit length of a wordline group of the wordline groups that is at a lower layer in the non-volatile memory with the 3-dimensional architecture is greater than a parity bit length of a wordline group of the wordline groups that is at a higher layer in the non-volatile memory with the 3-dimensional architecture.

6. A controller device for a non-volatile memory with a 3-dimensional architecture, comprising:
an error checking and correcting (ECC) circuit; and
a controller, coupled to the non-volatile memory with the 3-dimensional architecture and the ECC circuit, and configured to access a target wordline of the non-volatile memory with the 3-dimensional architecture based on a physical address, wherein the controller groups a plurality of wordlines of the non-volatile memory with the 3-dimensional architecture into a plurality of wordline groups, different wordline groups have different codeword structures, the controller controls the ECC circuit based on the codeword structure of the wordline group of the target wordline, and the ECC circuit generates a codeword to be stored in the target wordline under control of the controller or checks the codeword from the target wordline under control of the controller,
wherein the controller statically groups the wordlines into the wordline groups based on the number of layers of the wordlines in the non-volatile memory with the 3-dimensional architecture, and a parity bit length of the wordline group at a lower layer in the non-volatile memory with the 3-dimensional architecture is smaller than a parity bit length of the wordline group at a higher layer in the non-volatile memory with the 3-dimensional architecture.

7. A controller device for a non-volatile memory with a 3-dimensional architecture, comprising:
an error checking and correcting (ECC) circuit;
a controller, coupled to the non-volatile memory with the 3-dimensional architecture and the ECC circuit, and configured to access a target wordline of the non-volatile memory with the 3-dimensional architecture based on a physical address, wherein the controller groups a plurality of wordlines of the non-volatile memory with the 3-dimensional architecture into a plurality of wordline groups, different wordline groups have different codeword structures, the controller controls the ECC circuit based on the codeword structure of the wordline group of the target wordline, and the ECC circuit generates a codeword to be stored in the target wordline under control of the controller or checks the codeword from the target wordline under control of the controller; and
a lookup table, coupled to the controller and configured to record corresponding relations among the wordlines, the wordline groups, and the codeword structures of the non-volatile memory with the 3-dimensional architecture,
wherein the controller dynamically groups the wordlines into the wordline groups based on error bit counts of the wordlines, and a parity bit length of a wordline group of the wordline groups that has a greater error bit count is greater than a parity bit length of a wordline group of the wordline groups that has a smaller error bit count, and
wherein the controller dynamically groups the wordlines in a background operation and updates the lookup table.

8. The controller device as claimed in claim 7, wherein in one of the wordline groups, the wordlines are not all adjacent to each other.

9. The controller device as claimed in claim 1, wherein the codeword structures of different wordline groups have the same codeword length but have different parity bit lengths.

10. The controller device as claimed in claim 1, wherein the codeword structures of different wordline groups have the same data bit length but have different parity bit lengths.

11. The controller device as claimed in claim 1, wherein the codeword structures of different wordline groups have different codeword lengths, different data bit lengths, and different parity bit lengths.

12. The controller device as claimed in claim 1, wherein the codeword structures of different wordline groups have different codeword lengths and different data bit lengths, but have the same parity bit length.

13. An operation method for a non-volatile memory with a 3-dimensional architecture, comprising:
grouping, by a controller, a plurality of wordlines of the non-volatile memory with the 3-dimensional architecture into a plurality of wordline groups, wherein different wordline groups have different codeword structures; and
accessing, by the controller, a target wordline of the non-volatile memory with the 3-dimensional architecture based on a physical address, wherein the controller controls an error checking and correcting (ECC) circuit based on a codeword structure of the wordline group of the target wordline, and the ECC circuit generates a codeword to be stored in the target wordline under control of the controller or checks a codeword from the target wordline under control of the controller,
wherein the step of grouping the wordlines of the non-volatile memory with the 3-dimensional architecture into the wordline groups comprises:
statically grouping the wordlines into the wordline groups based on distances between the wordlines and a power supply source, wherein a codeword structure with a smaller parity bit length is assigned to a wordline group of the wordline groups that is closer to the power supply source, and a codeword structure with a greater parity bit length is assigned to a wordline group of the wordline groups that is more distant from the power supply source.

14. The operation method as claimed in claim 13, further comprising:
providing a lookup table to record corresponding relations among the wordlines, the wordline groups, and the codeword structures of the non-volatile memory with the 3-dimensional architecture.

15. The operation method as claimed in claim 14, wherein the controller groups the wordlines into the wordline groups based on the lookup table, and the codeword structures of different codeword groups have different parity bit lengths.

16. The operation method as claimed in claim 13, wherein in one of the wordline groups, the wordlines are adjacent to each other.

17. An operation method for a non-volatile memory with a 3-dimensional architecture, comprising:
grouping, by a controller, a plurality of wordlines of the non-volatile memory with the 3-dimensional architecture into a plurality of wordline groups, wherein different wordline groups have different codeword structures; and
accessing, by the controller, a target wordline of the non-volatile memory with the 3-dimensional architecture based on a physical address, wherein the controller controls an error checking and correcting (ECC) circuit based on a codeword structure of the wordline group of the target wordline, and the ECC circuit generates a codeword to be stored in the target wordline under control of the controller or checks a codeword from the target wordline under control of the controller,
wherein the step of grouping the wordlines of the non-volatile memory with the 3-dimensional architecture into the wordline groups comprises:
statically grouping the wordlines into the wordline groups based on the number of layers of the wordlines in the non-volatile memory with the 3-dimensional architecture, wherein a parity bit length of a wordline group of the wordline groups that is at a lower layer in the non-volatile memory with the 3-dimensional architecture is greater than a parity bit length of a wordline group of the wordline groups that is at a higher layer in the non-volatile memory with the 3-dimensional architecture.

18. An operation method for a non-volatile memory with a 3-dimensional architecture, comprising:
grouping, by a controller, a plurality of wordlines of the non-volatile memory with the 3-dimensional architecture into a plurality of wordline groups, wherein different wordline groups have different codeword structures; and
accessing, by the controller, a target wordline of the non-volatile memory with the 3-dimensional architecture based on a physical address, wherein the controller controls an error checking and correcting (ECC) circuit based on a codeword structure of the wordline group of the target wordline, and the ECC circuit generates a codeword to be stored in the target wordline under control of the controller or checks a codeword from the target wordline under control of the controller,
wherein the step of grouping the wordlines of the non-volatile memory with the 3-dimensional architecture into the wordline groups comprises:
statically grouping the wordlines into the wordline groups based on the number of layers of the wordlines in the non-volatile memory with the 3-dimensional architecture, wherein a parity bit length of a wordline group of the wordline groups that is at a lower layer in the non-volatile memory with the 3-dimensional architecture is smaller than a parity bit length of a wordline group of the wordline groups that is at a higher layer in the non-volatile memory with the 3-dimensional architecture.

19. An operation method for a non-volatile memory with a 3-dimensional architecture, comprising:
grouping, by a controller, a plurality of wordlines of the non-volatile memory with the 3-dimensional architecture into a plurality of wordline groups, wherein different wordline groups have different codeword structures;
accessing, by the controller, a target wordline of the non-volatile memory with the 3-dimensional architecture based on a physical address, wherein the controller controls an error checking and correcting (ECC) circuit based on a codeword structure of the wordline group of the target wordline, and the ECC circuit generates a codeword to be stored in the target wordline under control of the controller or checks a codeword from the target wordline under control of the controller; and
providing a lookup table to record corresponding relations among the wordlines, the wordline groups, and the codeword structures of the non-volatile memory with the 3-dimensional architecture, wherein the step of grouping the wordlines of the non-volatile memory with the 3-dimensional architecture into the wordline groups comprises:

dynamically grouping the wordlines into the wordline groups based on error bit counts of the wordlines, wherein a parity bit length of a wordline group of the wordline groups that has a greater error bit count is greater than a parity bit length of a wordline group of the wordline groups that has a smaller error bit count, and wherein the step of dynamically grouping the wordlines into the wordline groups are performed by the controller in a background operation, and the lookup table is correspondingly updated by the controller.

20. The operation method as claimed in claim 19, wherein in one of the wordline groups, the wordlines are not all adjacent to each other.

21. The operation method as claimed in claim 13, wherein the codeword structures of different wordline groups have the same codeword length but have different parity bit lengths.

22. The operation method as claimed in claim 13, wherein the codeword structures of different wordline groups have the same data bit length but have different parity bit lengths.

23. The operation method as claimed in claim 13, wherein the codeword structures of different wordline groups have different codeword lengths, different data bit lengths, and different parity bit lengths.

24. The operation method as claimed in claim 13, wherein the codeword structures of different wordline groups have different codeword lengths and different data bit lengths, but have the same parity bit length.

* * * * *